(12) United States Patent
Liu et al.

(10) Patent No.: US 10,407,577 B2
(45) Date of Patent: Sep. 10, 2019

(54) SLURRY COMPOSITIONS FOR USE IN FLAME RETARDANT AND HYDROPHOBIC COATINGS

(71) Applicant: J.M. Huber Corporation, Atlanta, GA (US)

(72) Inventors: Yue Liu, Marietta, GA (US); Aleksey Isarov, Kennesaw, GA (US); Mark Herndon, Fairmount, GA (US)

(73) Assignee: J.M. Huber Corporation, Atlanta, GA (US)

( * ) Notice: Subject to any disclaimer, the term of this patent is extended or adjusted under 35 U.S.C. 154(b) by 519 days.

(21) Appl. No.: 15/049,176

(22) Filed: Feb. 22, 2016

(65) Prior Publication Data

US 2016/0251522 A1 Sep. 1, 2016

Related U.S. Application Data

(60) Provisional application No. 62/121,790, filed on Feb. 27, 2015.

(51) Int. Cl.
*C09D 5/18* (2006.01)
*C23C 16/56* (2006.01)
*C09D 5/00* (2006.01)

(52) U.S. Cl.
CPC ............. *C09D 5/18* (2013.01); *C09D 5/00* (2013.01); *C23C 16/56* (2013.01)

(58) Field of Classification Search
CPC ............. C09D 5/18; C09D 5/00; C23C 16/56
See application file for complete search history.

(56) References Cited

U.S. PATENT DOCUMENTS

| | | | | |
|---|---|---|---|---|
| 3,912,674 A | * | 10/1975 | Stahl ..................... | C08L 31/04 524/272 |
| 5,968,669 A | * | 10/1999 | Liu ......................... | C02F 1/72 428/313.5 |
| 2010/0147188 A1 | * | 6/2010 | Mamak .................. | B82Y 30/00 106/31.13 |
| 2012/0114959 A1 | * | 5/2012 | Larsson ............... | D21H 19/385 428/511 |
| 2013/0143039 A1 | * | 6/2013 | Wilbur ................. | C09D 167/00 428/339 |
| 2013/0319626 A1 | | 12/2013 | Zhao et al. | |
| 2014/0370273 A1 | * | 12/2014 | Lyons ..................... | C09D 1/00 428/330 |

FOREIGN PATENT DOCUMENTS

| | | |
|---|---|---|
| WO | WO 2008/048438 | 4/2008 |
| WO | WO 2013/95908 | 6/2013 |

OTHER PUBLICATIONS

International Search Report and the Written Opinion of the International Searching Authority in PCT/US2016/018882 dated Apr. 29, 2016, 12 pages.
Almatis Premium Alumina, "HyBrite® 100 Aluminum Trihydroxides White Pigment Slurry for Ease of Use in Paper," Almatis Global Product Data (2003), 2 pages.
"Alumina Trihydrate (ATH)," Huber Engineered Materials (2015), Why Go Anywhere Else?, 5 pages.

* cited by examiner

*Primary Examiner* — Robert S Walters, Jr.
(74) *Attorney, Agent, or Firm* — Merchant & Gould P.C.

(57) ABSTRACT

Compositions containing an inorganic flame retardant, an organic amphiphilic compound, an optional suspension agent, and water are disclosed. These compositions can be used to produce coatings with both flame retardancy and water repellency for a variety of substrates.

21 Claims, No Drawings

SLURRY COMPOSITIONS FOR USE IN FLAME RETARDANT AND HYDROPHOBIC COATINGS

REFERENCE TO RELATED APPLICATION

This application claims the benefit of U.S. Provisional Application Ser. No. 62/121,790, filed on Feb. 27, 2015, the disclosure of which is incorporated herein by reference in its entirety.

BACKGROUND OF THE INVENTION

Conventional aqueous slurries of inorganic flame retardants, such as alumina trihydrate, can be used to form coatings on various substrates. However, such coatings lack hydrophobicity or water repellency. Applying certain surface treatments onto inorganic flame retardants can be used to impact hydrophobicity or water repellency, but such treated flame retardants cannot be used in water-based systems.

It would be beneficial to produce aqueous slurries of an inorganic flame retardant that can be used to form coatings characterized by both flame retardancy and water repellency. Accordingly, it is to these ends that the present invention is directed.

SUMMARY OF THE INVENTION

This summary is provided to introduce a selection of concepts in a simplified form that are further described below in the detailed description. This summary is not intended to identify required or essential features of the claimed subject matter. Nor is this summary intended to be used to limit the scope of the claimed subject matter.

Coating compositions are disclosed and described herein. In accordance with various aspects of this invention, such coating compositions can comprise (i) an inorganic flame retardant, (ii) an organic amphiphilic compound, and (iii) water. Often, the coating composition can further comprise (iv) a suspension agent.

Unexpectedly, the resultant dry coatings produced from these coating compositions can provide a unique combination of flame retardancy and water repellency.

Methods of coating a substrate also are provided herein, and in aspects of this invention, such methods can comprise (a) providing a coating composition (e.g., any coating composition disclosed herein), (b) applying the coating composition onto a surface of the substrate, and (c) curing the coating composition to form a dry coating on the substrate. Typical substrates can include, but are not limited to, metal, wood, paper, plastic, glass, fiberglass, and the like, as well as combinations thereof.

Both the foregoing summary and the following detailed description provide examples and are explanatory only. Accordingly, the foregoing summary and the following detailed description should not be considered to be restrictive. Further, features or variations may be provided in addition to those set forth herein. For example, certain aspects may be directed to various feature combinations and sub-combinations described in the detailed description.

DEFINITIONS

To define more clearly the terms used herein, the following definitions are provided. Unless otherwise indicated, the following definitions are applicable to this disclosure. If a term is used in this disclosure but is not specifically defined herein, the definition from the IUPAC Compendium of Chemical Terminology, 2nd Ed (1997), can be applied, as long as that definition does not conflict with any other disclosure or definition applied herein, or render indefinite or non-enabled any claim to which that definition is applied. To the extent that any definition or usage provided by any document incorporated herein by reference conflicts with the definition or usage provided herein, the definition or usage provided herein controls.

While compositions and methods are described herein in terms of "comprising" various components or steps, the compositions and methods can also "consist essentially of" or "consist of" the various components or steps, unless stated otherwise. For example, a coating composition consistent with aspects of the present invention can comprise; alternatively, can consist essentially of; or alternatively, can consist of (i) an inorganic flame retardant, (ii) an organic amphiphilic compound, and (iii) water.

The terms "a," "an," and "the" are intended to include plural alternatives, e.g., at least one, unless otherwise specified.

Generally, groups of elements are indicated using the numbering scheme indicated in the version of the periodic table of elements published in *Chemical and Engineering News*, 63(5), 27, 1985. In some instances, a group of elements can be indicated using a common name assigned to the group; for example, alkali metals for Group 1 elements, alkaline earth metals for Group 2 elements, and so forth.

The term "contacting" is used herein to refer to materials or components which can be blended, mixed, slurried, dissolved, reacted, treated, or otherwise contacted or combined in some other manner or by any suitable method. The materials or components can be contacted together in any order, in any manner, and for any length of time, unless otherwise specified.

Although any methods, devices, and materials similar or equivalent to those described herein can be used in the practice or testing of the invention, the typical methods, devices and materials are herein described.

All publications and patents mentioned herein are incorporated herein by reference for the purpose of describing and disclosing, for example, the constructs and methodologies that are described in the publications, which might be used in connection with the presently described invention. The publications discussed throughout the text are provided solely for their disclosure prior to the filing date of the present application.

Applicants disclose several types of ranges in the present invention. When Applicants disclose or claim a range of any type, Applicants' intent is to disclose or claim individually each possible number that such a range could reasonably encompass, including end points of the range as well as any sub-ranges and combinations of sub-ranges encompassed therein. As a representative example, the weight percentage of the inorganic flame retardant in the coating composition can be in certain ranges in various aspects of this invention. By a disclosure that the coating composition contains from about 20 to about 80 wt. % inorganic flame retardant, Applicants intend to recite that the weight percentage can be any weight percentage within the range and, for example, can be equal to about 20, about 25, about 30, about 35, about 40, about 45, about 50, about 55, about 60, about 65, about 70, about 75, or about 80 wt. %. Additionally, the weight percentage of the inorganic flame retardant in the coating composition can be within any range from about 20 to about 80 wt. % (for example, from about 50 to about 75 wt. %), and this also includes any combination of ranges between about 20 and about 80 wt. % (for example, the weight percentage can be in a range from about 25 to about 40 wt. %, or form about 60 to about 80 wt. %). Likewise, all other ranges disclosed herein should be interpreted in a manner similar to this example.

DETAILED DESCRIPTION OF THE INVENTION

Disclosed herein are coating compositions, methods of coating substrates with the coating compositions, dry or cured coatings produced from the coating compositions, and coated substrates. The coatings described herein can provide both flame retardancy and water repellency to a variety of substrates.

Coating Compositions

This invention is directed to and encompasses compositions, coatings, and articles of manufacture that contain an inorganic flame retardant. For example, a coating composition consistent with aspects of the present invention can comprise, or consist essentially of, or consist of, (i) an inorganic flame retardant, (ii) an organic amphiphilic compound, and (iii) water. In further aspects, and optionally, the coating composition can further comprise a suspension agent. In these and other aspects, the coating composition can comprise, or consist essentially of, or consist of, (i) an inorganic flame retardant, (ii) an organic amphiphilic compound, (iii) water, and (iv) a suspension agent.

In an aspect, the coating composition can comprise from about 10 to about 90 wt. % of the inorganic flame retardant. Often, the amount of the inorganic flame retardant in the coating composition can fall within a range from about 10 to about 80 wt. %, from about 20 to about 90 wt. %, or from about 20 to about 80 wt. %. In further aspects, the amount of the inorganic flame retardant in the coating composition can be in a range from about 40 to about 80 wt. %, from about 55 to about 85 wt. %, from about 50 to about 85 wt. %, from about 50 to about 75 wt. %, or from about 60 to about 80 wt. %. Other appropriate ranges for the amount of the inorganic flame retardant in the coating composition are readily apparent from this disclosure.

In an aspect, the coating composition can comprise from about 0.1 to about 10 wt. % of the organic amphiphilic compound. Alternatively, the amount of the organic amphiphilic compound in the coating composition can be in a range from about 0.1 to about 5 wt. %; alternatively, from about 0.1 to about 4 wt. %; alternatively, from about 0.5 to about 10 wt. %; alternatively, from about 0.5 to about 5 wt. %; alternatively, from about 0.5 to about 3 wt. %; alternatively, from about 1 to about 8 wt. %; alternatively, from about 1 to about 5 wt. %; or alternatively, from about 2 to about 4 wt. %. Other appropriate ranges for the amount of the organic amphiphilic compound in the coating composition are readily apparent from this disclosure.

When present in the composition, the amount of the suspension agent in the composition generally can fall within a range from about 0.05 to about 8 wt. % of the coating composition. For example, in one aspect, the coating composition can comprise from about 0.1 to about 4 wt. % of the suspension agent. In another aspect, the coating composition can comprise from about 0.2 to about 3 wt. % of the suspension agent. In yet another aspect, the coating composition can comprise from about 0.1 to about 2 wt. % of the suspension agent. In still another aspect, the coating composition can comprise from about 0.2 to about 2 wt. % of the suspension agent. Other appropriate ranges for the amount of the suspension agent in the coating composition, when present, are readily apparent from this disclosure.

As noted herein, the coating composition can comprise (i) an inorganic flame retardant, (ii) an organic amphiphilic compound, and (iii) water. While not being limited thereto, suitable inorganic flame retardants can include alumina trihydrate, magnesium hydroxide, calcium carbonate, calcium molybdate, zinc molybdate, ammonium molybdate, and the like, as well as combinations thereof. Accordingly, the inorganic flame retardant can comprise alumina trihydrate; alternatively, magnesium hydroxide; alternatively, calcium carbonate; alternatively, calcium molybdate; alternatively, zinc molybdate; or alternatively, ammonium molybdate.

In accordance with various aspects of this invention, the inorganic flame retardant can comprise alumina trihydrate. For example, the inorganic flame retardant can comprise precipitated alumina trihydrate (P-ATH). In further aspects, the alumina trihydrate can be untreated alumina trihydrate, i.e., the alumina trihydrate is not surface coated or surface treated to improve compatibility with polymers and plastics. While not wishing to be bound by this theory, Applicants believe that a surface treatment may result in poorer performance in the aqueous coating compositions described herein. Optionally, however, the ATH can be surface treated with any suitable agent that might improve adhesion, dispersibility, processability, flame retardancy, longevity, or shelf-life, and the like, as well as combinations of these properties. The particle size of the alumina trihydrate is not limited to any particular range; however, suitable alumina trihydrates often can have $D_{50}$ particle sizes ranging from about 0.25 to about 5 μm, or from about 0.5 to about 3 μm, and the like.

Calcium carbonate can be used as the inorganic flame retardant in the coating compositions described herein. While calcium carbonate is not universally considered be a traditional flame retardant, it is often used in certain end-use applications for that purpose. Moreover, calcium carbonate is often used in combination with other inorganic flame retardants, such as magnesium hydroxide and/or alumina trihydrate.

Referring now to the organic amphiphilic compound in the coating composition, the organic amphiphilic compound can comprise, for instance, an alkyl ketene dimer, an alkenyl succinic anhydride, a neutral rosin, and the like, as well as combinations thereof. In one aspect, the organic amphiphilic compound can comprise an alkyl ketene dimer, such as a $C_8$-$C_{36}$ alkyl ketene dimer, a $C_{12}$-$C_{32}$ alkyl ketene dimer, or a $C_{12}$-$C_{24}$ alkyl ketene dimer. Mixtures of more than one alkyl ketene dimer can be used. In another aspect, the organic amphiphilic compound can comprise an alkenyl succinic anhydride, such as a $C_8$-$C_{36}$ alkenyl succinic anhydride, a $C_{12}$-$C_{32}$ alkenyl succinic anhydride, or a $C_{12}$-$C_{24}$ alkenyl succinic anhydride. Mixtures of more than one alkenyl succinic anhydride can be used. In yet another aspect, the organic amphiphilic compound can comprise a neutral rosin. Suitable neutral rosins can be prepared by the reaction of a rosin (e.g., containing abietic acid) with a sodium base, such as sodium hydroxide, or sodium carbonate, and the like.

As noted herein, aspects of this invention are directed to coating compositions comprising (i) an inorganic flame retardant, (ii) an organic amphiphilic compound, (iii) water, and (iv) a suspension agent. While not being limited thereto, suitable suspension agents can include dispersants, thickeners, and the like, as well as combinations thereof. Illustrative suspension agents can include, but are not limited to, a polyacrylate dispersant, an alkali-swellable emulsion agent (ASE), a hydrophobically-modified alkali-swellable emulsion agent (HASE), a hydrophobically-modified ethoxylated urethane resin (HEUR), and the like, as well as combinations of two or more of these materials. For instance, the suspension agent can comprise a combination of an ASE agent and a polyacrylate dispersant.

In an aspect, the suspension agent can comprise an alkali-swellable emulsion agent (ASE), such as an anionic polyacrylate copolymer. The anionic polyacrylate copolymer can be synthesized from acid and acrylate co-monomers via emulsion polymerization. Commercially-available examples of suitable ASE suspension agents include Acrysol ASE-60 (Dow Chemical Company) and Viscalex HV30 (BASF).

In an aspect, the suspension agent can comprise a hydrophobically-modified alkali-swellable emulsion agent (HASE), such as a hydrophobically-modified anioinic polyacrylate copolymer. The hydrophobically-modified anioinic polyacrylate copolymer can be synthesized from an acid/acrylate copolymer backbone and including an ethoxylated hydrophobe. Commercially-available examples of HASE suspension agents include Acrysol DR-180 (Dow Chemical Company) and Rheovis 112 (BASF).

In an aspect, the suspension agent can comprise a hydrophobically-modified ethoxylated urethane resin (HEUR). The hydrophobically-modified ethoxylated urethane resin (HEUR) can be synthesized from an alcohol, a diisocyanate, and a polyethylene glycol. Commercially-available examples of HEUR suspension agents include Acrysol RM-300 (Dow Chemical Company) and DSX 3100 (BASF).

Often, the coating compositions contemplated herein can be aqueous slurries having from about 40 to about 80 wt. % solids, or from about 55 to about 75 wt. % solids, and the like. Accordingly, the amount of water in the coating compositions often can fall within a range from about 20 to about 60 wt. %, or from about 25 to about 45 wt. %, but can vary significantly depending upon the specific components of the coating compositions and the intended end-use application (e.g., the coating compositions can contain a minimum of about 10 wt. % water in some aspects, and a maximum of about 90 wt. % water in other aspects). While not being limited thereto, such coating compositions can have a Brookfield viscosity ranging from about 200 to about 5000 cP (centipoise) at 25° C. and 1 atm, or from about 200 to about 1500 cP, or from about 400 to about 2500 cP, or from about 400 to about 1200 cP, or from about 700 to about 1500 cP.

Unexpectedly, the coating compositions can form stable emulsions. As an example, the coating composition can be an emulsion that is stable for at least 1 week at 25° C. and 1 atm. In one aspect, the coating composition can be an emulsion that is stable for at least 1 month at 25° C. and 1 atm, while in another aspect, the coating composition can be an emulsion that is stable for at least 2 months at 25° C. and 1 atm. Consistent with aspects of this invention, coating compositions can form stable emulsions for time periods that may last as long as 3-6 months at 25° C. and 1 atm.

Any of the coating compositions described herein optionally can contain other ingredients or additives, dependent upon the desired properties and performance of the coating composition, of the resultant coating, of the end-use application, and so forth.

Coatings

Also encompassed herein are dry coatings (e.g., after drying or curing to form solid or cured particulates or films or layers) produced from the coating compositions (wet coating compositions) disclosed herein, which contain (i) an inorganic flame retardant, (ii) an organic amphiphilic compound, (iii) water, and (iv) optionally, a suspension agent. The coating weight of the dry coatings in accordance with the present invention typically can range from about 10 to about 500 gsm (grams per square meter), depending upon the end-use application, the targeted substrate, the expected environmental conditions, and so forth. For example, the coating can have a coating weight in a range from about 10 to about 300 gsm, from about 40 to about 450 gsm, from about 35 to about 350 gsm, or from about 40 to about 150 gsm.

Unexpectedly, the dry coatings disclosed and described herein can provide both flame retardancy and hydrophobicity (or water repellency). A typical test used to measure or quantify the hydrophobicity (or water repellency) of the coating is a surface penetration test described in the example section below. In an aspect, the coatings of this invention can pass the surface penetration test for 30 minutes (alternatively, for 1 hour) using a water test solution. Additionally or alternatively, the disclosed coatings can pass the surface penetration test for 5 minutes (alternatively, for 15 minutes) using a test solution consisting of 28 vol. % ethanol and 72 vol. % water. Additionally or alternatively, the disclosed coatings can pass the surface penetration test for 1 minute (alternatively, for 10 minutes) using a test solution consisting of 40 vol. % ethanol and 60 vol. % water.

Also encompassed herein are articles of manufacture, which can comprise a substrate at least partially covered with a coating, e.g., produced from any of the coating compositions containing any of the inorganic flame retardants, any of the organic amphiphilic compounds, and optionally, any of the suspension agents disclosed herein. Accordingly, coated substrates that comprise a substrate at least partially covered with the coatings described herein are also within the scope of this invention. Generally, substrates that can be employed in this invention can comprise metal, wood, paper, plastic, glass, fiberglass, and the like, as well as combinations thereof.

This invention also discloses methods of coating a substrate, or for producing a coated substrate. One such method can comprise (a) providing any coating composition disclosed herein, (b) applying the composition onto a surface of the substrate, and (c) curing the composition to form a dry coating on the substrate. Coating compositions can be applied to the substrate by a variety of techniques, including, for example, dipping, rolling, brushing, spraying, squeeging, backrolling, pouring, troweling, and the like. Combinations of these techniques also can be used. The coating composition can be used on both interior and exterior surfaces of substrates, if desired. As described herein, typical coating weights can range from about 10 and about 500 gsm, from about 10 to about 300 gsm, from about 40 to about 450 gsm, from about 35 to about 350 gsm, or from about 40 to about 150 gsm.

The conditions under which the coating composition is cured to form the dry coating on the substrate are not particularly limited. Nonetheless, suitable curing temperatures often range from about 100 to about 200° C., or from about 125 to about 175° C. While not wishing to be bound by the following theory, it is believed that lower curing temperatures can be used, but water repellency may be adversely impacted. Curing times can vary significantly depending upon the coating weight, the curing temperature, and so forth, but typically can range from about 1 minute to about 8 hours, from about 2 minutes to about 2 hours, or from about 2 minutes to about 30 minutes.

The dry coatings and coated substrates produced herein, unexpectedly, can have both flame retardancy and hydrophobicity (or water repellency). In an aspect, the coatings (or coated substrates) of this invention can pass the surface penetration test for 30 minutes (alternatively, for 1 hour) using a water test solution. Additionally or alternatively, the disclosed coatings (or coated substrates) can pass the surface penetration test for 5 minutes (alternatively, for 15 minutes) using a test solution consisting of 28 vol. % ethanol and 72 vol. % water. Additionally or alternatively, the disclosed coatings (or coated substrates) can pass the surface penetration test for 1 minute (alternatively, for 10 minutes) using a test solution consisting of 40 vol. % ethanol and 60 vol. % water. As described herein, typical substrates include, but are not limited to, metal, wood, paper, plastic, glass, fiberglass, and the like, as well as combinations thereof.

EXAMPLES

The invention is further illustrated by the following examples, which are not to be construed in any way as imposing limitations to the scope of this invention. Various other aspects, embodiments, modifications, and equivalents thereof which, after reading the description herein, may suggest themselves to one of ordinary skill in the art without departing from the spirit of the present invention or the scope of the appended claims.

Coating compositions were prepared by adding to water, in order, a polyacrylate dispersant (0.6 wt. % of the coating composition), alumina trihydrate (70 wt. % of the coating composition), an ASE suspension agent (Acrysol ASE-60, 0.3 wt. % of the coating, composition), and an organic amphiphilic compound (if used, 1.5-2.8 wt. % of the coating composition), and mixing for 20 min at 25° C. Table I summarizes certain information on the coating compositions of Examples 1-4.

In Examples 1-4, the alumina trihydrate that was used in the coating compositions was an uncoated, precipitated alumina trihydrate (P-Al H) having a $D_{50}$ median particle size of 1.2 μm. The alkyl ketene dimer was a mixture of 60 wt. % $C_{16}$ and 40 wt. $C_{18}$ alkyl ketene dimer, and the alkenyl succinic anhydride was a mixture of 40 wt. % $C_{16}$ and 60 wt. % $C_{18}$ alkenyl succinic anhydride. Ethoquad 18/25 is octadecylmethyl[polyoxyethylene (15)] ammonium chloride, available from Akzo Nobel N.V.

TABLE I

Compositions of Examples 1-4.

| Example | Additive | Additive Concentration (wt. %) | Viscosity (cP) |
|---|---|---|---|
| 1 | Alkyl ketene dimer | 2.8 | 924 |
| 2 | Alkenyl succinic Anhydride | 1.5 | 1,460 |
| 3 | Ethoquad 18/25 | 2.8 | 26,500 |
| 4 | None | 0 | 1,056 |

A coater was used to prepare coatings (300 gsm dry, except for Example 2, which used 60 gsm dry) from these coating compositions onto a fiberglass nonwoven veil material having a basis weight of 8 gsm. After the coating composition was applied to the nonwoven, the material was cured at 160° C. for about 10 minutes. The coated and cured fiberglass webs were tested for hydrophobicity (or water repellency) using a surface penetration test. A single drop of a test solution—either (a) water, (b) 28 vol. % ethanol and 72 vol. % water, or (c) 40 vol. % ethanol and 60 vol. % water—was placed on the coated fiberglass nonwoven substrate. The amount of time between the placement of the drop and its disappearance from the coated surface and penetration into/through the substrate was recorded. Table II summarizes the surface penetration test results for the coated substrates of Examples 1-4, in which longer time periods equate to higher hydrophobicity (water repellency). Fields in Table II with a "0" mean that the drop of the test solution penetrated into the substrate immediately, i.e., no hydrophobicity (no water repellency).

Unexpectedly, Table II demonstrates that the coatings of Examples 1-2 were far superior to those of Examples 3-4 for every type of test solution that was evaluated. The drop of water remained on the surface of the coated substrates of Examples 1-2 for at least 1 hour, whereas the drop of water remained on the surface for only 7 min in Example 3, and penetrated immediately for the control (no additive) substrate of Example 4. Likewise, the drop of the test solution consisting of 28 vol. % ethanol and 72 vol. water remained on the surface of the coated substrates of Examples 1-2 for at least 30 min, whereas the drop of the test solution consisting, of 28 vol. % ethanol and 72 vol. % water penetrated immediately into the substrates of Examples 3-4. As for the test solution, consisting of 40 vol, % ethanol and 60 vol. % water, only the coating of Example 1 prevented rapid surface penetration.

TABLE II

Coating Performance of Examples 1-4.

| Example | 40 vol. % ethanol 60 vol. % water | 28 vol. % ethanol 72 vol. % water | 100% water |
|---|---|---|---|
| 1 | 25 min | 59 min | >1 hr |
| 2 | 0 | 36 min | >1 hr |
| 3 | 0 | 0 | 7 min |
| 4 | 0 | 0 | 0 |

The invention is described above with reference to numerous aspects and embodiments, and specific examples. Many variations will suggest themselves to those skilled in the art in light of the above detailed description. All such obvious variations are within the full intended scope of the appended claims. Other embodiments of the invention can include, but are not limited to, the following (embodiments are described as "comprising" but, alternatively, can "consist essentially of" or "consist of"):

Embodiment 1. A coating composition comprising (i) an inorganic flame retardant, (ii) an organic amphiphilic compound, and (iii) water.

Embodiment 2. The composition defined in embodiment 1, wherein the inorganic flame retardant comprises any suitable flame retardant, or any flame retardant disclosed herein, e.g., alumina trihydrate, magnesium hydroxide, calcium carbonate, calcium molybdate, zinc molybdate, ammonium molybdate, etc., or a combination thereof Embodiment 3. The composition defined in embodiment 1, wherein the inorganic flame retardant comprises alumina trihydrate.

Embodiment 4. The composition defined in embodiment 1, wherein the inorganic flame retardant comprises magnesium hydroxide.

Embodiment 5. The composition defined in embodiment 1, wherein the inorganic flame retardant comprises calcium carbonate.

Embodiment 6. The composition defined in any one of the preceding embodiments, wherein the coating composition comprises any suitable amount of the inorganic flame retardant, or any amount disclosed herein, e.g., from about 10 to about 90 wt. %, from about 20 to about 80 wt. %, from about 50 to about 75 wt. %, etc., inorganic flame retardant.

Embodiment 7. The composition defined in any one of embodiments 1-6, wherein the organic amphiphilic compound comprises any suitable organic amphiphilic compound, or any organic amphiphilic compound disclosed herein, e.g., an alkyl ketene dimer, an alkenyl succinic anhydride, a neutral rosin, etc., or a combination thereof Embodiment 8. The composition defined in any one of embodiments 1-6, wherein the organic amphiphilic compound comprises an alkyl ketene dimer.

Embodiment 9. The composition defined in any one of embodiments 1-6, wherein the organic amphiphilic compound comprises a $C_8$-$C_{36}$ alkyl ketene dimer.

Embodiment 10. The composition defined in any one of embodiments 1-6, wherein the organic amphiphilic compound comprises an alkenyl succinic anhydride.

Embodiment 11. The composition defined in any one of embodiments 1-6, wherein the organic amphiphilic compound comprises a $C_8$-$C_{36}$ alkenyl succinic anhydride.

Embodiment 12. The composition defined in any one of embodiments 1-6, wherein the organic amphiphilic compound comprises a neutral rosin.

Embodiment 13. The composition defined in any one of embodiments 1-6, wherein the organic amphiphilic compound comprises a neutral rosin prepared by reacting a rosin with a sodium base.

Embodiment 14. The composition defined in any one of the preceding embodiments, wherein the coating composition comprises any suitable amount of the organic amphiphilic compound, or any amount disclosed herein, e.g., from about 0.1 to about 10 wt. %, from about 0.5 to about 5 wt. %, from about 2 to about 4 wt. %, etc., organic amphiphilic compound.

Embodiment 15. The composition defined in any one of the preceding embodiments, wherein the coating composition further comprises a suspension agent.

Embodiment 16. The composition defined in embodiment 15, wherein the suspension agent comprises a dispersant, a thickener, or a combination thereof.

Embodiment 17. The composition defined in embodiment 15 or 16, wherein the suspension agent comprises any suitable suspension agent, or any suspension agent disclosed herein, e.g., a polyacrylate dispersant, an alkali-swellable emulsion agent (ASE), a hydrophobically-modified alkali-swellable emulsion agent (HASE), a hydrophobically-modified ethoxylated urethane resin (HEUR), etc., or a combination thereof.

Embodiment 18. The composition defined in any one of embodiments 15-17, wherein the suspension agent comprises an alkali-swellable emulsion agent (ASE).

Embodiment 19. The composition defined in any one of embodiments 15-17, wherein the suspension agent comprises an alkali-swellable emulsion agent (ASE) comprising an anionic polyacrylate copolymer.

Embodiment 20. The composition defined in any one of embodiments 15-17, wherein the suspension agent comprises a hydrophobically-modified alkali-swellable emulsion agent (HASE).

Embodiment 21. The composition defined in any one of embodiments 15-17, wherein the suspension agent comprises a hydrophobically-modified alkali-swellable emulsion agent (HASE) comprising a hydrophobically-modified anioinic polyacrylate copolymer.

Embodiment 22. The composition defined in any one of embodiments 15-17, wherein the suspension agent comprises a hydrophobically-modified ethoxylated urethane resin (HEUR).

Embodiment 23. The composition defined in any one of embodiments 15-17, wherein the suspension agent comprises a hydrophobically-modified ethoxylated urethane resin (HEUR) prepared from an alcohol, a diisocyanate, and a polyethylene glycol.

Embodiment 24. The composition defined in any one of embodiments 15-23, wherein the coating composition comprises any suitable amount of the suspension agent, or any amount disclosed herein, e.g., from about 0.05 to about 8 wt. %, from about 0.1 to about 4 wt. %, from about 0.2 to about 2 wt. %, etc., suspension agent.

Embodiment 25. The composition defined in any one of the preceding embodiments, wherein the coating composition is an aqueous slurry comprising any suitable % solids, or any % solids disclosed herein, e.g., from about 40 to about 80 wt. % solids, from about 55 to about 75 wt. % solids, etc.

Embodiment 26. The composition defined in any one of the preceding embodiments, wherein the coating composition is an emulsion that is stable under any suitable conditions, or any conditions disclosed herein, e.g., stable for at least 1 week at 25° C. and 1 atm, stable for at least 1 month at 25° C. and 1 atm, stable for at least 2 months at 25° C. and 1 atm, etc.

Embodiment 27. The composition defined in any one of the preceding embodiments, wherein the coating composition has any suitable Brookfield viscosity, or a Brookfield viscosity in any range disclosed herein, e.g., from about 200 to about 5000 cP at 25° C. and 1 atm, from about 200 to about 1500 cP at 25° C. and 1 atm, from about 400 to about 2500 cP at 25° C. and 1 atm, etc.

Embodiment 28. The composition defined in any one of the preceding embodiments, wherein the inorganic flame retardant comprises alumina trihydrate having any suitable $D_{50}$ particle size, or a $D_{50}$ particle size in any range disclosed herein, e.g., from about 0.25 to about 5 µm, from about 0.5 to about 3 µm, etc.

Embodiment 29. The composition defined in any one of the preceding embodiments, wherein the inorganic flame retardant comprises precipitated alumina trihydrate (P-ATH).

Embodiment 30. The composition defined in any one of the preceding embodiments, wherein the inorganic flame retardant comprises untreated alumina trihydrate.

Embodiment 31. A dry coating produced from the coating composition defined in any one of embodiments 1-30.

Embodiment 32. The coating defined in embodiment 31, wherein the dry coating has any suitable coating weight, or a coating weight in any range disclosed herein, e.g., from about 10 to about 500 gsm, from about 35 to about 350 gsm, etc.

Embodiment 33. The coating defined in embodiment 31 or 32, wherein the dry coating passes a surface penetration test for 30 minutes using a water test solution, and/or the coating passes a surface penetration test for 5 minutes using a test solution consisting of 28 vol. % ethanol and 72 vol. % water, and/or the coating passes a surface penetration test for 1 minute using a test solution consisting of 40 vol. % ethanol and 60 vol. % water.

Embodiment 34. An article of manufacture comprising a substrate at least partially covered with the dry coating defined in any one of embodiments 31-33.

Embodiment 35. An article of manufacture comprising a substrate at least partially covered with the dry coating defined in any one of embodiments 31-33, wherein the substrate comprises metal, wood, paper, plastic, glass, fiberglass, or combinations thereof.

Embodiment 36. A method of coating a substrate, the method comprising (A) applying a coating composition onto a surface of the substrate, wherein the coating composition is defined in any one of embodiments 1-30, and (B) curing the coating composition to form a dry coating on the substrate.

Embodiment 37. The method defined in embodiment 36, wherein the dry coating has any suitable coating weight, or a coating weight in any range disclosed herein, e.g., from about 10 to about 500 gsm, from about 35 to about 350 gsm, etc.

Embodiment 38. The method defined in embodiment 36 or 37, wherein step (B) is conducted at any suitable temperature, or a temperature in any range disclosed herein, e.g., from about 100 to about 200° C., from about 125 to about 175° C., etc.

Embodiment 39. The method defined in any one of embodiments 36-38, wherein step (B) is conducted for any suitable period of time, or any time period disclosed herein, e.g., from about 1 minute to about 8 hours, from about 2 minutes to about 2 hours, etc.

Embodiment 40. The method defined in any one of embodiments 36-39, wherein the substrate comprises metal, wood, paper, plastic, glass, fiberglass, or combinations thereof.

Embodiment 41. The method defined in any one of embodiments 36-39, wherein the substrate comprises a fiberglass nonwoven having a basis weight of 8 gsm.

Embodiment 42. A coated substrate prepared by the method defined in any one of embodiments 36-41.

Embodiment 43. The coated substrate defined in embodiment 42, wherein the coated substrate passes a surface penetration test for 30 minutes using a water test solution, and/or the coated substrate passes a surface penetration test for 5 minutes using a test solution consisting of 28 vol. % ethanol and 72 vol. % water, and/or the coated substrate passes a surface penetration test for 1 minute using a test solution consisting of 40 vol. % ethanol and 60 vol. % water.

We claim:

1. A method of coating a substrate, the method comprising:
    (A) applying a coating composition onto a surface of the substrate, wherein the coating composition comprises:
        (i) from about 10 to about 90 wt. % of an inorganic flame retardant;
        (ii) an organic amphiphilic compound; and
        (iii) water; and
    (B) curing the coating composition to form a dry coating on the substrate;
    wherein the inorganic flame retardant comprises alumina trihydrate, magnesium hydroxide, or both; and
    wherein the organic amphiphilic compound comprises an alkyl ketene dimer, an alkenyl succinic anhydride, a neutral rosin, or a combination thereof.

2. The method of claim 1, wherein the coating composition further comprises a suspension agent.

3. The method of claim 2, wherein:
    the coating composition is an emulsion that is stable for at least 1 week at 25° C. and 1 atm; and
    the suspension agent comprises a polyacrylate dispersant, an alkali-swellable emulsion agent (ASE), a hydrophobically-modified alkali-swellable emulsion agent (HASE), a hydrophobically-modified ethoxylated urethane resin (HEUR), or a combination thereof.

4. The method of claim 1, wherein curing the coating composition is conducted at a temperature in a range from about 100 to about 200° C.

5. The method of claim 1, wherein a coating weight of the dry coating is in a range from about 10 to about 500 grams per square meter (gsm).

6. The method of claim 1, wherein the substrate comprises metal, wood, paper, plastic, glass, fiberglass, or combinations thereof.

7. The method of claim 1, wherein:
    the coating composition is an aqueous slurry comprising from about 40 to about 80 wt. % solids; and
    the coating composition has a Brookfield viscosity in a range from about 200 to about 5000 cP at 25° C. and 1 atm.

8. The method of claim 1, wherein:
    the dry coating passes a surface penetration test for 30 minutes using a water test solution;
    the dry coating passes a surface penetration test for 5 minutes using a test solution consisting of 28 vol. % ethanol and 72 vol. % water;
    the dry coating passes a surface penetration test for 1 minute using a test solution consisting of 40 vol. % ethanol and 60 vol. % water; or
    any combination thereof.

9. A method of coating a substrate, the method comprising:
    (A) applying a coating composition onto a surface of the substrate, wherein the coating composition comprises:
        (i) an inorganic flame retardant;
        (ii) an organic amphiphilic compound; and
        (iii) water; and
    (B) curing the coating composition to form a dry coating on the substrate;
    wherein the dry coating passes a surface penetration test for 30 minutes using a water test solution.

10. The method of claim 9, wherein the dry coating passes a surface penetration test for 5 minutes using a test solution consisting of 28 vol. % ethanol and 72 vol. % water.

11. The method of claim 9, wherein the dry coating passes a surface penetration test for 1 minute using a test solution consisting of 40 vol. % ethanol and 60 vol. % water.

12. The method of claim 9, wherein the substrate comprises fiberglass.

13. The method of claim 9, wherein the coating composition comprises:
    from about 25 to about 45 wt. % water;
    from about 0.1 to about 10 wt. % organic amphiphilic compound;
    from about 50 to about 75 wt. % inorganic flame retardant; and
    from about 0.05 to about 8 wt. % suspension agent;
    wherein the coating composition has a Brookfield viscosity in a range from about 200 to about 5000 cP at 25° C. and 1 atm.

14. The method of claim 9, wherein:
    the inorganic flame retardant comprises alumina trihydrate; and
    the organic amphiphilic compound comprises an alkyl ketene dimer.

15. The method of claim 14, wherein the substrate comprises glass and/or fiberglass.

16. The method of claim 15, wherein the coating composition further comprises a suspension agent.

17. A method of coating a substrate, the method comprising:
(A) applying a coating composition onto a surface of the substrate, wherein the coating composition comprises:
(i) from about 10 to about 90 wt. % of an inorganic flame retardant comprising alumina trihydrate, magnesium hydroxide, or both;
(ii) an organic amphiphilic compound;
(iii) a suspension agent comprising a polyacrylate dispersant, an alkali-swellable emulsion agent (ASE), a hydrophobically-modified alkali-swellable emulsion agent (HASE), a hydrophobically-modified ethoxylated urethane resin (HEUR), or a combination thereof; and
(iv) water; and
(B) curing the coating composition to form a dry coating on the substrate.

18. The method of claim 17, wherein the coating composition comprises:
from about 50 to about 75 wt. % inorganic flame retardant;
from about 0.1 to about 10 wt. % organic amphiphilic compound;
from about 0.05 to about 8 wt. % suspension agent; and
from about 25 to about 45 wt. % water.

19. The method of claim 18, wherein:
the coating composition has a Brookfield viscosity in a range from about 200 to about 5000 cP at 25° C. and 1 atm; and
the coating composition is an emulsion that is stable for at least 1 week at 25° C. and 1 atm.

20. The method of claim 18, wherein:
the inorganic flame retardant comprises alumina trihydrate; and
the organic amphiphilic compound comprises an alkyl ketene dimer.

21. The method of claim 20, wherein the substrate comprises glass and/or fiberglass.

* * * * *